(12) United States Patent
Ameling et al.

(10) Patent No.: US 10,514,276 B2
(45) Date of Patent: Dec. 24, 2019

(54) SENSOR DEVICE

(71) Applicant: Carl Zeiss SMT GmbH, Oberkochen (DE)

(72) Inventors: Ralf Ameling, Aalen (DE); Markus Hauf, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/247,672

(22) Filed: Jan. 15, 2019

(65) Prior Publication Data

US 2019/0195659 A1 Jun. 27, 2019

Related U.S. Application Data

(63) Continuation of application No. PCT/EP2017/066785, filed on Jul. 5, 2017.

(30) Foreign Application Priority Data

Jul. 18, 2016 (DE) ........................ 10 2016 213 026

(51) Int. Cl.
*G01D 5/24* (2006.01)
*G03F 7/20* (2006.01)
(Continued)

(52) U.S. Cl.
CPC ............ *G01D 5/24* (2013.01); *G02B 19/0023* (2013.01); *G02B 19/0047* (2013.01); *G02B 26/0833* (2013.01); *G02B 26/101* (2013.01);

*G03F 7/70075* (2013.01); *G03F 7/7085* (2013.01); *G03F 7/70116* (2013.01); *G03F 7/70825* (2013.01)

(58) Field of Classification Search
CPC . G02B 26/0833; G02B 26/0841; G03F 7/702; G03F 7/7085; G03F 7/70825; B81B 2201/033; B81B 2203/0136; B81B 2203/04; G01D 5/24; G01D 5/2412
See application file for complete search history.

(56) References Cited

U.S. PATENT DOCUMENTS

| 6,781,279 B2 | 8/2004 | Lee et al. |
| 7,258,010 B2 * | 8/2007 | Horning ................. H02N 1/008 73/504.14 |

(Continued)

FOREIGN PATENT DOCUMENTS

| DE | 10 2013 201 506 A1 | 1/2013 |
| DE | 10 2013 201 509 A1 | 8/2013 |

(Continued)

OTHER PUBLICATIONS

International Search Report and Written Opinion for corresponding PCT Appl No. PCT/EP2017/066785, dated Oct. 26, 2017.
(Continued)

*Primary Examiner* — Steven Whitesell Gordon
(74) *Attorney, Agent, or Firm* — Fish & Richardson P.C.

(57) ABSTRACT

A sensor device for capturing the displacement position of an optical component includes a plurality of stator electrodes and a mechanism or restricting the electric field that is relevant to the measurement of the displacement position to the region of the stator electrodes.

20 Claims, 6 Drawing Sheets

(51) Int. Cl.
  *G02B 26/08*  (2006.01)
  *G02B 19/00*  (2006.01)
  *G02B 26/10*  (2006.01)

(56) References Cited

U.S. PATENT DOCUMENTS

| | | | | |
|---|---|---|---|---|
| 2010/0142020 | A1* | 6/2010 | Kim | G02B 26/0841 |
| | | | | 359/200.6 |
| 2014/0327895 | A1* | 11/2014 | Waldis | G02B 26/0833 |
| | | | | 355/67 |
| 2016/0025964 | A1* | 1/2016 | Torayashiki | G02B 26/0816 |
| | | | | 359/221.2 |
| 2017/0363861 | A1* | 12/2017 | Hauf | G02B 19/0095 |
| 2018/0188656 | A1* | 7/2018 | Bihr | G01D 5/24 |

FOREIGN PATENT DOCUMENTS

| | | |
|---|---|---|
| DE | 10 2013 206 529 A1 | 4/2014 |
| DE | 10 2015 204 874 A1 | 9/2016 |
| EP | 1 180 493 A2 | 2/2002 |
| EP | 1 225 481 A2 | 7/2002 |
| WO | WO 2010/049076 A2 | 5/2010 |

OTHER PUBLICATIONS

German Examination Report, with translation thereof, for corresponding DE Appl No. 10 2016 213 026.9, dated Apr. 7, 2017.

\* cited by examiner

SENSOR DEVICE

CROSS-REFERENCE TO RELATED APPLICATIONS

The present application is a continuation of, and claims benefit under 35 USC 120 to, international application PCT/EP2017/066785, filed Jul. 5, 2017, which claims benefit under 35 USC 119 of German Application No. 10 2016 213 026.9, filed Jul. 18, 2016. The entire disclosure of these applications are incorporated by reference herein.

FIELD

The disclosure relates to a sensor device, in particular for capturing a displacement position of an optical component. Moreover, the disclosure relates to an optical component having such a sensor device and to a multi-mirror arrangement having a multiplicity of such optical components. Further, the disclosure relates to an illumination optical unit and an illumination system for a projection exposure apparatus, and a microlithographic projection exposure apparatus. In addition, the disclosure relates to a method for producing a microstructured or nanostructured component and to a component produced according to the method.

BACKGROUND

DE 10 2015 204 874 A1 has disclosed a mirror array having a multiplicity of displaceable individual mirrors. In particular, this mirror array comprises sensor devices for capturing the pivot positions of the individual mirrors.

SUMMARY

The present disclosure seeks to improve a sensor device for such a multi-arrangement, an optical component and a corresponding multi-mirror arrangement.

In a general aspect, the disclosure provides a sensor device for capturing a displacement position of an optical component. The sensor device includes a plurality of stator electrodes, which each have a plurality of individual electrodes that are arranged in a ring-shaped region and that each extend in a plane through a central axis of this region. The sensor device also includes at least one movable electrode, which leads to variable shielding of an electric field in the region of the stator electrodes depending on the displacement position of the optical component. The sensor device further includes at least one mechanism for restricting the electric field that is relevant to the measurement of the displacement position of the optical component to the region of the stator electrodes.

The core of the disclosure includes providing at least one mechanism for restricting the electric field that is relevant to the measurement of the displacement position to the region of the stator electrodes, in particular to the region between adjacent individual electrodes of the stator electrodes. In particular, the mechanism serve to minimize the influence of inhomogeneous stray fields in the edge region of the stator electrodes, in particular in the radial edge regions of the comb fingers of the stator electrodes, on the measurement of the displacement position. As a result of this, the sensitivity of the sensor device in relation to a linear displacement and/or expansion of the optical component relative to the stator electrodes, in particular on account of the thermal expansion of the optical component, and/or the sensitivity in relation to manufacturing tolerances can be reduced. As a result, the capture of the displacement position of the optical component becomes, in particular, more robust, in particular less susceptible to errors.

In particular, the stator electrodes are comb electrodes. In particular, the stator electrodes each have a plurality of comb fingers. Consequently, the comb fingers each form individual electrodes of the stator electrodes. Therefore, the comb fingers themselves are sometimes also referred to as stator electrodes. Provided this does not lead to a lack of clarity, this designation is likewise adopted in part below. Consequently, the term stator electrode can firstly denote the stator electrode as a whole with a multiplicity of comb fingers and, secondly, the individual comb fingers as well. Which of these alternatives is meant in each case arises unambiguously from the respective context.

The movable electrode is, in particular, a comb electrode arranged on the optical component, in particular in the form of a mirror.

The optical component is, in particular, a mirror, in particular a micromirror, i.e., a mirror with an edge length in the micrometer range, in particular with an edge length of less than 10 mm, in particular less than 5 mm, in particular less than 3 mm, in particular less than 2 mm, in particular less than 1 mm. In particular, this can be a so-called microelectromechanical system (MEMS).

According to one aspect of the disclosure, the individual electrodes of the stator electrodes are arranged in a ring-shaped region and each extend in a plane through the central axis of this region. In particular, the stator electrodes extend in the radial direction toward the central axis of this region. In particular, this is a circular-ring-shaped comb electrode structure. Such a structure was found to be advantageous, in particular for geometric or mechanical reasons.

According to a further aspect of the disclosure, the stator electrodes are divided into a plurality of sectors, wherein the electrodes in the same sector form a sensor unit. In particular, the electrodes are divided into four quadrants. A division deviating herefrom, in particular a division into two, three or more sectors, is likewise possible.

According to a further aspect of the disclosure, the electrodes in quadrants that lie opposite one another in respect of the central axis of the ring-shaped region are differentially interconnected. As a result of this, the sensitivity in relation to linear disturbances, in particular in the direction of a surface normal of the reflection surface of the mirror, can be reduced. In respect of further advantages, reference is made to DE 10 2015 204 874 A1, the content of which is incorporated in its entirety in the present application as a component thereof.

In particular, the sensor device comprises differential sensors in the form of capacitive comb transducers, by which the relative position between a movable armature and a stationary stator can be determined by way of a capacitance measurement. Here, provision is made, in particular, for measuring the capacitance between adjacent comb fingers of the stator electrodes, the fingers of the movable electrode forming movable armature combs which cause variable, position-dependent shielding. This variant is also referred to as shielding mode (shield mode).

Compared to direct measurement of the capacitance between a stator comb finger and moveable comb finger, the shielding mode is advantageous in that it is relatively insensitive in relation to a parasitic movement of the combs relative to one another.

In the case of a differential interconnection of the sensors, a tilt angle is determined from the measurement of two vertical movements. Common mode movements, which are, for example, caused by a vertical movement of the mirror that is caused by thermal expansion, do not contribute to the measurement signal of the measured mirror tilt angle on account of the difference being formed. The differential sensor arrangement is advantageous in that the tilt position of the mirror is captured directly and completely by way of the sensor pairs. In particular, to a first approximation, it is not reliant on the stability of the mechanical point of rotation, i.e., of the effective center of gravity.

According to a further aspect of the disclosure, the at least one mechanism for restricting the electric field that is relevant to the measurement of the displacement position to the region between the stator electrode fingers comprises shielding electrodes. The shielding electrodes are also referred to as guard electrodes. In particular, they serve to shield from stray electric fields in the edge regions of the stator electrodes.

In particular, the shielding electrodes are each arranged along a continuation of one of the stator electrodes. In particular, they each are arranged on the outside and/or inside in the radial direction, i.e., at the edges of the stator electrodes, along a continuation thereof. This leads to an effective restriction of the electric field that is relevant to the measurement to the region between two stator electrodes. In particular, with the aid of the shielding electrodes it is possible to minimize the influence of inhomogeneous stray fields in the edge regions of the stator electrodes, in particular in the radial edge regions of the comb fingers of the stator electrodes, on the measurement of the displacement position.

According to a further aspect of the disclosure, at least a subset of the shielding electrodes has a U-shaped cross section. In particular, it is possible to form all shielding electrodes, in particular all outer shielding electrodes and/or all inner shielding electrodes, with a U-shaped cross section. To this end, two adjacent shielding electrodes can be respectively connected to one another by a connection piece. The connection piece can have an arcuate embodiment. It can also have a straight-lined embodiment. In this case, the shielding electrodes have a U-shaped cross section with three straight-lined limbs.

The angle between the two free limbs and the connection limb of the shielding electrode to the outside in the radial direction is in particular slightly less than 90°. In particular, it is in the range of 80° to 89°. In particular, the angle between the free limbs and the connection limb of the shielding electrode to the outside in the radial direction is exactly half the size of the difference between 180° and the angular spacing of two adjacent stator electrodes.

The angle between the two free limbs and the connection limb of the shielding electrode to the inside in the radial direction is in particular slightly greater than 90°. In particular, it is in the range of 91° to 100°. In particular, the angle between the free limbs and the connection limb of the shielding electrode to the inside in the radial direction is exactly half the size of the sum of 180° and the angular spacing of two adjacent stator electrodes.

In the case of a curved embodiment of the connection limb, the latter can have a center of curvature that just coincides with the central axis of the ring-shaped region of the stator electrodes. In this case, the angle between the free limbs and the connection limb of the shielding electrodes can be 90°.

According to a further aspect of the disclosure, the at least one movable electrode extends over the entire region between the stator electrodes, in particular over the entire region between two adjacent comb fingers of the stator electrodes, in the radial direction and into the region between two shielding electrodes arranged along the continuation of these stator electrodes. In particular, the movable electrodes are each embodied extended beyond the region between the stator electrodes to the inside and outside in the radial direction. This can ensure that they completely cover the region between two adjacent comb fingers of the stator electrodes in the radial direction, at least in a sectional plane perpendicular to the central axis of the ring-shaped region of the stator electrodes, even in the case of a minor movement in the radial direction, in particular on account of disturbances, manufacturing tolerances or on account of the thermal expansion. This applies, in particular, to a sectional plane in the region of the free ends of the stator electrodes that face the displaceable optical component. The movable electrode is also referred to as mirror electrode or as sensor/transducer mirror electrode.

In particular, the movable electrodes are embodied in such a way that the overlap thereof with the stator electrodes in the radial direction does not change in the case of a minor displacement of the movable electrodes relative to the stator electrodes in the radial direction.

What this can achieve is that the sensor device is insensitive in relation to such relative movements of the movable electrodes in relation to the stator electrodes. In particular, the sensor device is insensitive to such relative movements of the movable electrodes in relation to the stator electrodes, even in the tilted state of the optical component.

According to a further aspect of the disclosure, the shielding electrodes are each held at the same electric potential as the at least one movable electrode.

The shielding electrodes can also be held at the same electric potential as the stator electrodes.

In particular, the shielding electrodes can be connected to the at least one movable electrode in electrically conductive fashion.

In particular, they can be electrically conductively connected to one another among themselves.

According to one aspect of the disclosure, at least one subset of the shielding electrodes, in particular, is connected to one another in electrically conductive fashion so as to form a ring-shaped structure. In particular, provision can be made for all of the inner shielding electrodes and/or all of the outer shielding electrodes to be connected to one another in electrically conductive fashion in each case so as to form a ring-shaped structure. In particular, provision can be made for all shielding electrodes that are arranged within the ring-shaped structure of the stator electrodes to be connected to one another in electrically conductive fashion. In particular, provision can be made for all shielding electrodes that are arranged outside of the ring-shaped structure of the stator electrodes to be connected to one another in electrically conductive fashion. In this case, the shielding electrodes serve, in particular, for shielding electrical disturbances as well. This also improves the function of the sensor device.

An advantage of the embodiment and arrangement of the shielding electrodes according to the disclosure consists of this solution for improving the robustness in relation to radial displacements of the movable electrodes in relation to the stator electrodes involving only very little space.

The advantages of an optical component having a sensor device according to the preceding description arise from those of the sensor device. In particular, the optical component is a mirror, in particular a micromirror, in particular a MEMS mirror. In particular, this can relate to a mirror with an EUV reflective coating. In particular, the mirror can have at least two degrees of freedom of displacement. In particular, it can be pivotable about two tilt axes, in particular two tilt axes that are aligned perpendicular to one another. In particular, the mirror can be mounted via a flexure. In particular, the mirror can be mounted via a Cardan-type bearing.

The advantages of a multi-mirror arrangement, which is also referred to as multi-mirror array (MMA), likewise are evident from those of the sensor device. In particular, the sensor device described above leads to greater precision and a lower susceptibility to errors of the displacement of the individual mirrors. In particular, the sensor device described above involves very little additional space. In particular, this is advantageous in the case of small individual mirrors, in particular so-called micromirrors. In particular, the number of individual mirrors of the multi-mirror arrangement can be at least 100, in particular at least 1000, in particular at least 10 000, in particular at least 100 000. Usually, it is less than 10 000 000, in particular less than 1 000 000.

Further aspects of the disclosure are to seek to improve an illumination optical unit and an illumination system for a projection exposure apparatus, and a microlithographic projection exposure apparatus.

These aspects can be achieved via a multi-mirror arrangement according to the description above. The advantages are evident, once again, from those of the above-described sensor device.

A further aspect of the disclosure is to seek to improve a method for producing a microstructured or nanostructured component, in particular a semiconductor chip, and also such a component.

These aspects can be achieved by providing a projection exposure apparatus as described above.

The advantages are evident, once again, from those of the sensor device. The higher precision and lower susceptibility to errors of the displacement of the individual mirrors leads, in particular, to a higher precision and lower susceptibility to errors when exposing a reticle with structures to be imaged and hence to a higher precision when imaging these structures onto a wafer to be exposed.

BRIEF DESCRIPTION OF THE DRAWINGS

Further advantages and details of the disclosure emerge from the description of exemplary embodiments with reference to the drawings, in which.

DESCRIPTION OF EXEMPLARY EMBODIMENTS

Firstly, the general construction of a projection exposure apparatus 1 and the constituent parts thereof will be described. For details in this regard, reference should be made to WO 2010/049076 A2, which is hereby fully incorporated in the present application as part thereof. The description of the general structure of the projection exposure apparatus 1 should only be understood to be exemplary. It serves to explain a possible application of the subject matter of the present disclosure. The subject matter of the present disclosure can also be used in other optical systems, in particular in alternative variants of projection exposure apparatuses.

Figure 1:
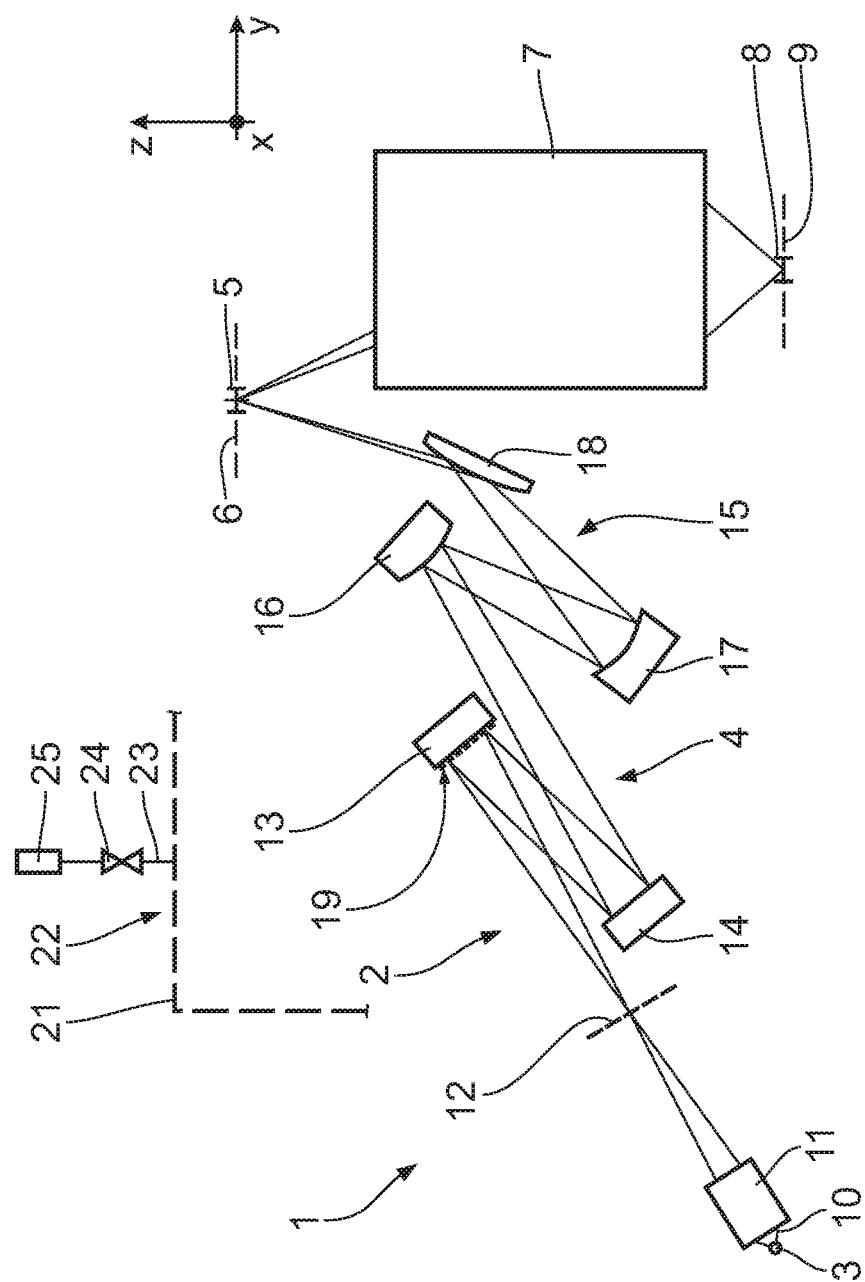
FIG. 1 shows a schematic illustration of a projection exposure apparatus and its constituent parts.

FIG. 1 schematically shows a microlithographic projection exposure apparatus 1 in a meridional section. An illumination system 2 of the projection exposure apparatus 1 has, besides a radiation source 3, an illumination optical unit 4 for the exposure of an object field 5 in an object plane 6. The object field 5 can be shaped in a rectangular fashion or in an arcuate fashion with an x/y aspect ratio of 13/1, for example. In this case, a reflective reticle (not illustrated in FIG. 1) arranged in the object field 5 is exposed, said reticle bearing a structure to be projected by the projection exposure apparatus 1 for the production of microstructured or nanostructured semiconductor components. A projection optical unit 7 serves for imaging the object field 5 into an image field 8 in an image plane 9. The structure on the reticle is imaged onto a light-sensitive layer of a wafer, which is not illustrated in the drawing and is arranged in the region of the image field 8 in the image plane 9.

The reticle, which is held by a reticle holder (not illustrated), and the wafer, which is held by a wafer holder (not illustrated), are scanned synchronously in the y-direction during the operation of the projection exposure apparatus 1. Depending on the imaging scale of the projection optical unit 7, it is also possible for the reticle to be scanned in the opposite direction relative to the wafer.

The radiation source 3 is an EUV radiation source having an emitted used radiation in the range of between 5 nm and 30 nm. This can be a plasma source, for example a GDPP (Gas Discharge Produced Plasma) source or an LPP (Laser Produced Plasma) source. Other EUV radiation sources, for example those based on a synchrotron or on a free electron laser (FEL), are also possible.

EUV radiation 10 emerging from the radiation source 3 is focused by a collector 11. A corresponding collector is known for example from EP 1 225 481 A2. Downstream of the collector 11, the EUV radiation 10 propagates through an intermediate focal plane 12 before being incident on a field facet mirror 13. The field facet mirror 13 is arranged in a plane of the illumination optical unit 4 which is optically conjugate with respect to the object plane 6. The field facet mirror 13 may be arranged at a distance from a plane that is conjugate to the object plane 6. In this case, it is referred to, in general, as first facet mirror.

The EUV radiation 10 is also referred to hereinafter as used radiation, illumination radiation or as imaging light.

Downstream of the field facet mirror 13, the EUV radiation 10 is reflected by a pupil facet mirror 14. The pupil facet mirror 14 lies either in the entrance pupil plane of the projection optical unit 7 or in an optically conjugate plane with respect thereto. It may also be arranged at a distance from such a plane.

The field facet mirror 13 and the pupil facet mirror 14 are constructed from a multiplicity of individual mirrors, which will be described in even greater detail below. In this case, the subdivision of the field facet mirror 13 into individual mirrors can be such that each of the field facets which illuminate the entire object field 5 by themselves is represented by exactly one of the individual mirrors. Alternatively, it is possible to construct at least some or all of the field facets using a plurality of such individual mirrors. The same correspondingly applies to the configuration of the pupil facets of the pupil facet mirror 14, which are respectively assigned to the field facets and which can be formed in each case by a single individual mirror or by a plurality of such individual mirrors.

The EUV radiation 10 impinges on both facet mirrors 13, 14 at a defined angle of incidence. In particular, the two facet mirrors are impinged with EUV radiation 10 in the range associated with normal incidence operation, i.e. with an angle of incidence that is less than or equal to 25° in relation to the mirror normal. Impingement with grazing incidence is also possible. The pupil facet mirror 14 is arranged in a plane of the illumination optical unit 4 which constitutes a pupil plane of the projection optical unit 7 or is optically conjugate with respect to a pupil plane of the projection optical unit 7. With the aid of the pupil facet mirror 14 and an imaging optical assembly in the form of a transfer optical unit 15 having mirrors 16, 17 and 18 designated in the order of the beam path for the EUV radiation 10, the field facets of the field facet mirror 13 are imaged into the object field 5 in a manner being superimposed on one another. The last mirror 18 of the transfer optical unit 15 is a mirror for grazing incidence ("grazing incidence mirror"). The transfer optical unit 15 together with the pupil facet mirror 14 is also referred to as a sequential optical unit for transferring the EUV radiation 10 from the field facet mirror 13 toward the object field 5. The illumination light 10 is guided from the radiation source 3 toward the object field 5 via a plurality of illumination channels. Each of these illumination channels is assigned a field facet of the field facet mirror 13 and a pupil facet of the pupil facet mirror 14, said pupil facet being disposed downstream of the field facet. The individual mirrors of the field facet mirror 13 and of the pupil facet mirror 14 can be tiltable by an actuator system, such that a change in the assignment of the pupil facets to the field facets and correspondingly a changed configuration of the illumination channels can be achieved. This results in different illumination settings, which differ in the distribution of the illumination angles of the illumination light 10 over the object field 5.

In order to facilitate the explanation of positional relationships, use is made below of, inter alia, a global Cartesian xyz-coordinate system. The x-axis runs perpendicular to the plane of the drawing toward the observer in FIG. 1. The y-axis runs toward the right in FIG. 1. The z-axis runs upward in FIG. 1.

Different illumination systems can be achieved via a tilting of the individual mirrors of the field facet mirror 13 and a corresponding change in the assignment of said individual mirrors of the field facet mirror 13 to the individual mirrors of the pupil facet mirror 14. Depending on the tilting of the individual mirrors of the field facet mirror 13, the individual mirrors of the pupil facet mirror 14 that are newly assigned to said individual mirrors are tracked by tilting such that an imaging of the field facets of the field facet mirror 13 into the object field 5 is once again ensured.

Further aspects of the illumination optical unit 4 are described below.

The one field facet mirror 13 in the form of a multi-mirror arrangement, which is also referred to as multi- or micro-mirror array (MMA), forms an example of an optical assembly for guiding the used radiation 10, that is to say the EUV radiation beam. The field facet mirror 13 is embodied as a microelectromechanical system (MEMS). It has a multiplicity of individual mirrors 20 arranged in a matrix-like manner in rows and columns in a mirror array 19. The mirror arrays 19 are embodied in a modular manner. They can be arranged on a carrying structure that is embodied as a base plate. Here, it is possible to arrange any number of the mirror arrays 19 next to one another. Consequently, the overall reflection surface which is formed by the totality of all mirror arrays 19, in particular the individual mirrors 20 thereof, is extendable as desired. In particular, the mirror arrays are embodied in such a way that they facilitate a substantially gap-free tessellation of a plane. The ratio of the sum of the reflection surfaces 26 of the individual mirrors 20 to the overall area that is covered by mirror arrays 19 is also referred to as integration density. In particular, this integration density is at least 0.5, in particular at least 0.6, in particular at least 0.7, in particular at least 0.8, in particular at least 0.9.

The individual mirrors 20 are designed to be tiltable by an actuator system, as will be explained below. Overall, the field facet mirror 13 has approximately 100 000 of the individual mirrors 20. The field facet mirror 13 may also have a different number of individual mirrors 20 depending on the size of the individual mirrors 20. The number of individual mirrors 20 of the field facet mirror 13 is in particular at least 1000, in particular at least 5000, in particular at least 10 000. It can be up to 100 000, in particular up to 300 000, in particular up to 500 000, in particular up to 1 000 000, in particular up to 10 000 000.

A spectral filter can be arranged upstream of the field facet mirror 13 and separates the used radiation 10 from other wavelength components of the emission of the radiation source 3 that are not usable for the projection exposure. The spectral filter is not illustrated.

The field facet mirror 13 is impinged on by used radiation 10 having a power of, for example, 840 W and a power density of 6.5 kW/m$^2$.

The entire individual mirror array of the facet mirror 13 has, for example, a diameter of 500 mm and is designed in a closely packed manner with the individual mirrors 20. In so far as a field facet is realized by exactly one individual mirror in each case, the individual mirrors 20 represent the shape of the object field 5, apart from the scaling factor. The facet mirror 13 can be formed from 500 individual mirrors 20 each representing a field facet and having a dimension of approximately 5 mm in one direction and 100 mm in a direction perpendicular thereto. As an alternative to the realization of each field facet by exactly one individual mirror 20, each of the field facets can be approximated by groups of smaller individual mirrors 20. A field facet having dimensions of 5 mm in one direction and of 100 mm in a direction perpendicular thereto can be constructed e.g. via a 1×20 array of individual mirrors 20 having dimensions of 5 mm×5 mm through to a 10×200 array of individual mirrors 20 having dimensions of 0.5 mm×0.5 mm. Here, in particular, the short direction is aligned in such a way that it corresponds to the scanning direction, or extends parallel thereto, when imaging into the object field 5.

The tilt angles of the individual mirrors 20 are adjusted for changing the illumination settings. In particular, the tilt angles have a displacement range of ±50 mrad, in particular ±100 mrad. An accuracy of better than 0.2 mrad, in particular better than 0.1 mrad, is achieved when setting the tilt position of the individual mirrors 20.

The individual mirrors 20 of the field facet mirror 13 and of the pupil facet mirror 14 in the embodiment of the illumination optical unit 4 according to FIG. 1 bear multilayer coatings for optimizing their reflectivity at the wavelength of the used radiation 10. The temperature of the multilayer coatings should not exceed 425 K during the operation of the projection exposure apparatus 1. This is achieved by a suitable structure of the individual mirrors 20. For details, reference is made to DE 10 2013 206 529 A1, which is hereby fully incorporated into the present application.

The individual mirrors 20 of the illumination optical unit 4 are accommodated in an evacuable chamber 21, a boundary wall 22 of which is indicated in FIG. 1. The chamber 21 communicates with a vacuum pump 25 via a fluid line 23, in which a shut-off valve 24 is accommodated. The operating pressure in the evacuable chamber 21 is a few pascals, in particular 3 Pa to 5 Pa (partial pressure $H_2$). All other partial pressures are significantly below $1 \times 10^{-7}$ mbar.

Together with the evacuable chamber 21, the mirror having the plurality of individual mirrors 20 forms an optical assembly for guiding a beam of the EUV radiation 10.

Each of the individual mirrors 20 can have a reflection surface 26 having dimensions of 0.1 mm×0.1 mm, 0.5 mm×0.5 mm, 0.6 mm×0.6 mm, or else of up to 5 mm×5 mm or larger. The reflection surface 26 can also have smaller dimensions. In particular, it has side lengths in the μm range or low mm range. The individual mirrors 20 are therefore also referred to as micromirrors. The reflection surface 26 is part of a mirror body 27 of the individual mirror 20. The mirror body 27 carries the multilayer coating.

With the aid of the projection exposure apparatus 1, at least one part of the reticle is imaged onto a region of a light-sensitive layer on the wafer for the lithographic production of a micro- or nanostructured component, in particular of a semiconductor component, e.g. of a microchip. Depending on the embodiment of the projection exposure apparatus 1 as a scanner or as a stepper, the reticle and the wafer are moved in a temporally synchronized manner in the y-direction continuously in scanner operation or step by step in stepper operation.

Further details and aspects of the mirror array 19, in particular of the optical components which comprise the individual mirrors 20, are described below.

Initially, a first variant of an optical component 30 comprising an individual mirror 20 and, in particular, the displacement device 31 for displacing, in particular for pivoting, the individual mirror 20 is described with reference to FIGS. 2 and 3.

Figure 2:
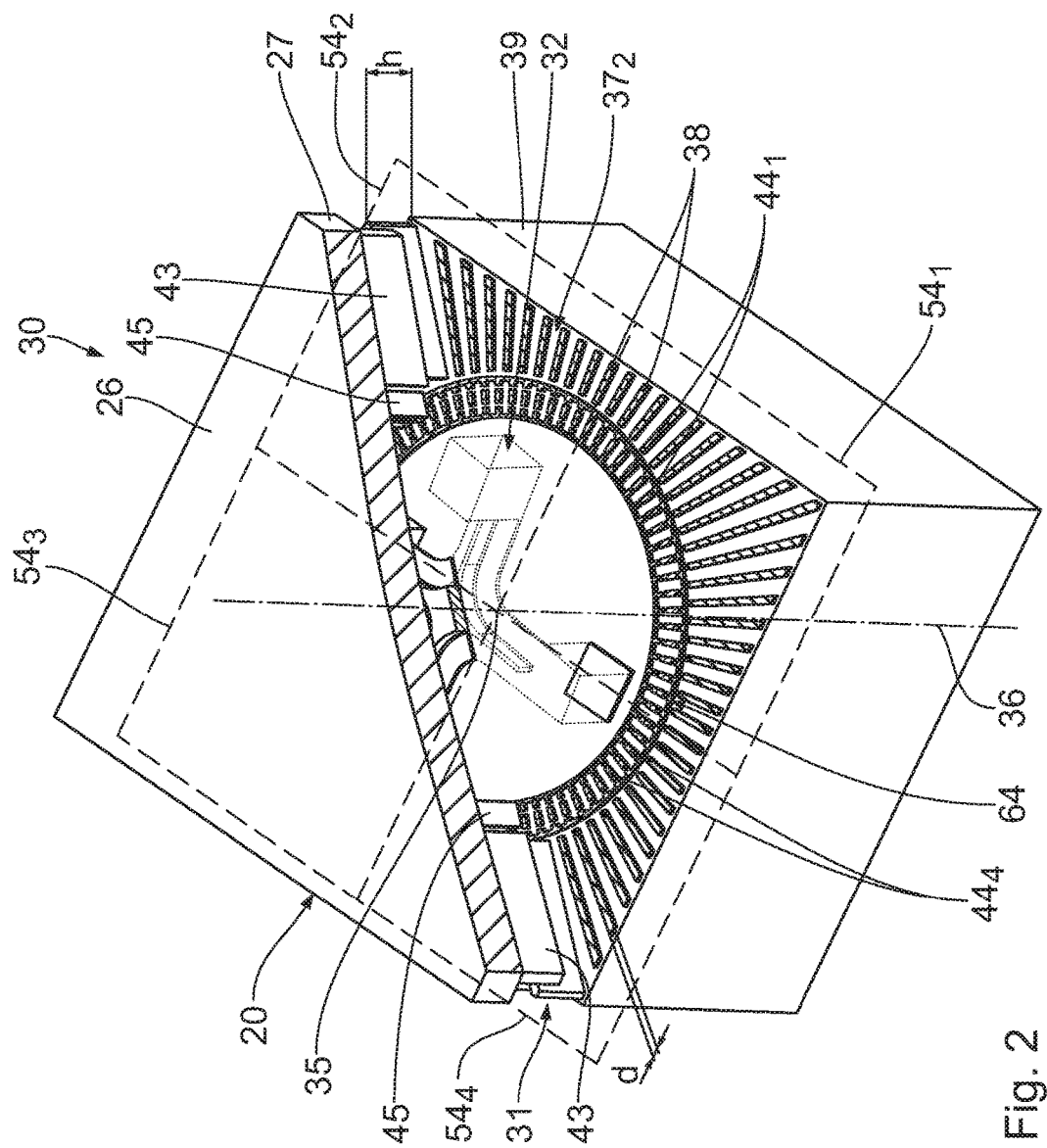
FIG. 2 shows a schematic illustration of an optical component with an actuator device and a sensor devices.
Figure 3:
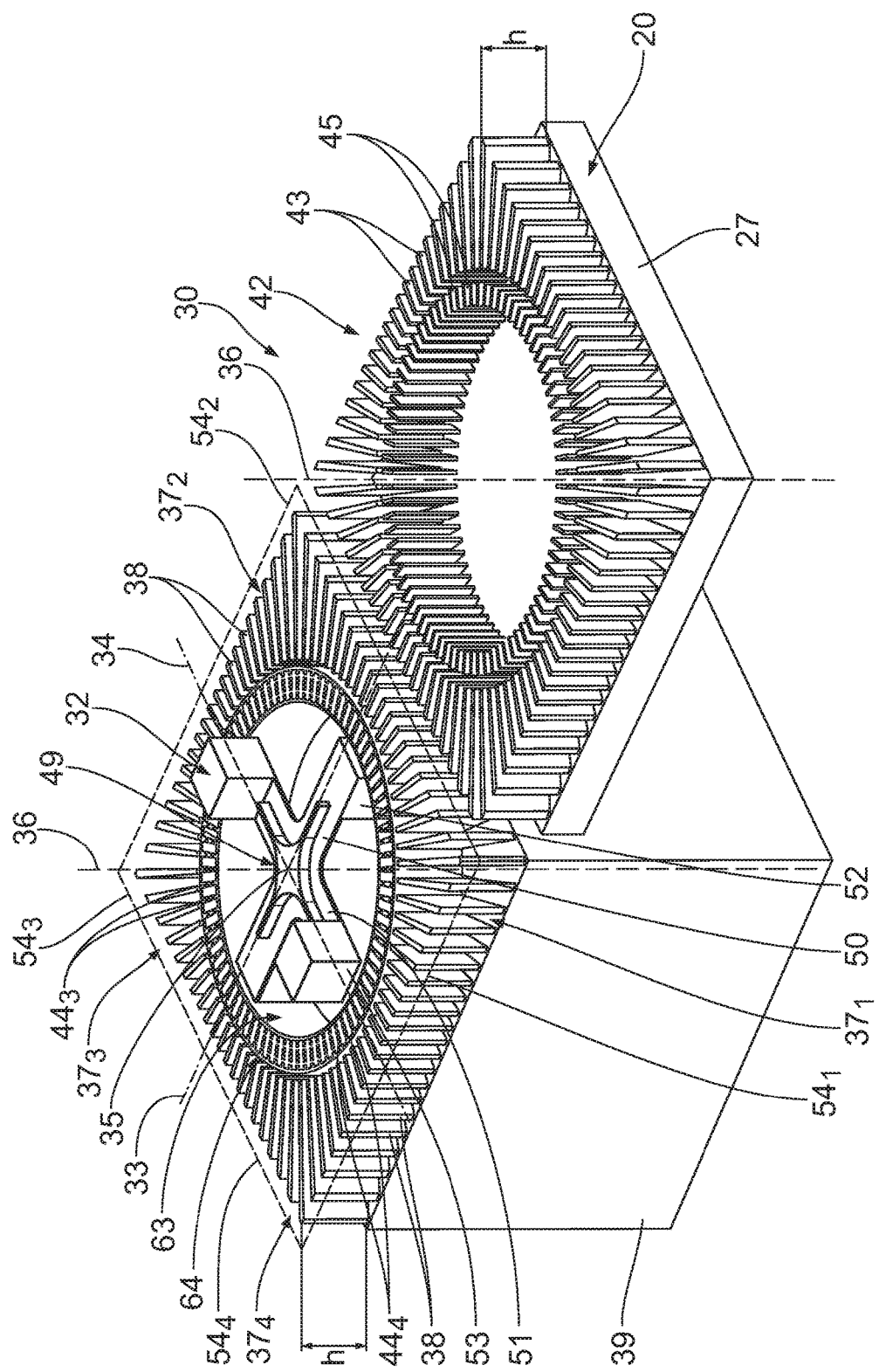
FIG. 3 shows an alternative illustration of the optical component in accordance with FIG. 2, in which the mirror body with the counter electrodes or shielding elements arranged thereon is folded to the side.

The representation in accordance with FIG. 3 corresponds to that in accordance with FIG. 2, with the mirror body 27 of the individual mirror 20 being folded away to the side in FIG. 3. As a result, the structures of the displacement device 31 and of the sensor device are better visible.

The optical component 30 comprises the individual mirror 20 which, in particular, is embodied as a micromirror. The individual mirror 20 comprises the mirror body 27 described above, on the front side of which the reflection surface 26 is formed. In particular, the reflection surface 26 is formed by a multilayer structure. In particular, it has a radiation reflecting property for the illumination radiation 10, in particular for EUV radiation.

In accordance with the variant represented in the figures, the reflection surface 26 has a square embodiment; however, it is represented in a partly sectioned manner in order also to show the actuator system. It generally has a rectangular embodiment. It can also have a triangular or hexagonal embodiment. In particular, it has a tile-like embodiment such that a gap-free tessellation of a plane by way of the individual mirrors 20 is possible. The individual mirror 20 is mounted via a joint 32 that will still be described in more detail below. In particular, it is mounted in such a way that it has two degrees of freedom of tilting. In particular, the joint 32 facilitates the tilting of the individual mirror 20 about two tilt axes 33, 34. The tilt axes 33, 34 are perpendicular to one another. They intersect at a central point of intersection, which is referred to as effective pivot point 35.

To the extent that the individual mirror 20 is in a non-pivoted neutral position, the effective pivot point 35 lies on a surface normal 36 which extends through a central point, in particular the geometric centroid of the reflection surface 26.

To the extent that nothing else is specified, the direction of the surface normal 36 in the following text is always understood to mean the direction of same in the non-tilted neutral position of the individual mirror 20.

Firstly, the displacement device 31 is described in greater detail below.

The displacement device 31 comprises an electrode structure comprising actuator transducer stator electrodes $37_i$ and actuator transducer mirror electrodes 42. In accordance with the variant illustrated in FIGS. 2 and 3, the electrode structure comprises four actuator transducer stator electrodes $37_1$, $37_2$, $37_3$, and $37_4$. In general, the number of actuator transducer stator electrodes $37_i$ is at least 2. It may be 3, 4 or more.

All actuator transducer electrodes $37_i$, 42 are embodied as comb electrodes comprising a plurality of comb fingers 38. The respectively complementary comb fingers of the mirror and stator engage in one another in this case. The combs of the individual actuator electrodes $37_i$ in each case comprise 30 actuator transducer stator comb fingers 38, which are also abbreviated as stator comb fingers or merely as comb fingers below. A respectively different number is likewise possible. The number of the comb fingers 38 of the actuator transducer stator electrodes $37_i$ is, in particular at least 2, in particular at least 3, in particular at least 5, in particular at least 10. It can be up to 50, in particular up to 100.

The combs of the actuator transducer mirror electrodes 42 accordingly comprise actuator transducer mirror comb fingers 43, which are also abbreviated as mirror comb fingers or merely as comb fingers below. The number of the mirror comb fingers 43 corresponds to the number of the stator comb fingers. It may also deviate by one per electrode from the number of stator comb fingers in each case.

The comb fingers 38 are arranged in such a way that they extend in the radial direction in relation to the surface normal 36 or the effective pivot point 35. In accordance with a variant that is not illustrated in the figures, the comb fingers 38, 43 may also be arranged tangentially to circles around the effective pivot point 35. They may also have an embodiment which corresponds to sections of concentric circular cylinder lateral surfaces around the surface normal 36.

All of the actuator transducer stator electrodes $37_i$ are arranged on a carrying structure in the form of a substrate 39. In particular, they are arranged on the substrate 39 in a stationary manner. In particular, they are arranged in a single plane that is defined by the front side of the substrate 39. This plane is also referred to as actuator plane or as comb plane.

In particular, a wafer serves as a substrate 39. The substrate 39 is also referred to as base plate.

The actuator transducer stator electrodes $37_i$ are respectively arranged in a region on the substrate 39 which, firstly, has a square outer contour and, secondly, a circular inner contour. As an alternative thereto, the actuator transducer stator electrodes $37_i$ may also be arranged in a circular-ring-shaped region on the substrate 39. Here, the outer contour also has a circular embodiment. In particular, the individual actuator transducer stator electrodes $37_i$ are respectively arranged in circular-ring-segment-shaped regions. The electrode structure overall, i.e. all actuator transducer stator electrodes $37_i$, are arranged in a region which has an outer contour that, to all intents and purposes, corresponds to that of the reflection surface of the individual mirror 20. It may also be arranged in a slightly smaller region, in particular a region that is smaller by approximately 5% to 25%.

The electrode structure has a radial symmetry. In particular, it has a fourfold radial symmetry. The electrode structure may also have a different radial symmetry. In particular, it may have a threefold radial symmetry. In particular, it has a k-fold radial symmetry, where k specifies the number of actuator transducer stator electrodes $37_i$. Apart from the subdivision of the electrode structure in the cross section into the different actuator transducer stator electrodes $37_i$, the electrode structure has an n-fold radial symmetry, where n precisely corresponds to the overall number of comb fingers 38 of all actuator transducer stator electrodes $37_i$. However, the comb fingers 38 of the actuator transducer stator electrodes $37_i$ can have different lengths.

The individual actuator transducer stator electrodes $37_i$ can have different embodiments. In particular, they may be embodied depending on the mechanical properties of the joint 32. They can also have an identical embodiment.

The comb fingers 38 are arranged radially in relation to the effective pivot point 35, or radially in relation to the alignment of the surface normal 36 in the non-pivoted neutral state of the individual mirror 20.

In the case of individual mirrors 20, the mirror bodies 27 of which have dimensions of 1 mm·1 mm, the comb fingers 38 have a thickness d in the range of 8 μm to 20 μm at their outer end in the radial direction. In general, the maximum thickness d of the comb fingers 38 at their outer end in the radial direction lies in the range of 1 μm to 30 μm.

The comb fingers 38 have a height h, i.e. an extent in the direction of the surface normal 36, which is in the range of 10 μm to 150 μm, in particular in the range of 50 μm to 120 μm. Other values are likewise conceivable. The height h is constant in the radial direction. It may also decrease in the radial direction. This can facilitate larger tilt angles, without this leading to the comb fingers of the actuator mirror electrode 42 being incident on the base plate.

Adjacent comb fingers 38, 43 of the actuator electrodes $37_i$ on the one hand and of the actuator mirror electrodes 42 on the other hand have a minimum spacing in the range of 1 μm to 10 μm, in particular in the range of 3 μm to 7 μm, in particular approximately 5 μm, in the non-pivoted state of the individual mirror 20. These values can be scaled appropriately for individual mirrors 20 with smaller or larger dimensions.

This minimum spacing is the minimum distance between adjacent mirror comb fingers and stator comb fingers, measured in the neutral, non-pivoted state of the individual mirror 20. The comb fingers may approach one another when the individual mirror 20 is tilted. The minimum spacing is selected in such a way that there is no collision between adjacent mirror comb fingers and stator comb fingers, even in the case of the maximum tilt of the individual mirror 20. Here, manufacturing tolerances are taken into account. Such manufacturing tolerances are a few micrometers, in particular at most 3 μm, in particular at most 2 μm, in particular at most 1 μm.

The maximum possible approach of adjacent comb fingers 38, 43 can easily be determined from the geometric details of the same and the arrangement thereof, and the maximum possible tilt of the individual mirror 20. In the present embodiment, the maximum approach of adjacent comb fingers 38, 43 is approximately 2 μm in the case of a tilt of the individual mirror 20 by 100 mrad. In particular, the maximum approach is less than 10 μm, in particular less than 7 μm, in particular less than 5 μm, in particular less than 3 μm.

The actuator transducer stator electrodes $37_i$ respectively interact with an actuator mirror electrode 42. The actuator mirror electrode 42 is connected to the mirror body 27. In particular, the actuator mirror electrode 42 is connected in a mechanically secured manner to the mirror body 27. The actuator transducer mirror electrodes 42 form a counter electrode to the actuator transducer stator electrodes $37_i$. Therefore, they are also simply referred to as counter electrode.

The actuator mirror electrode 42 forms a passive electrode structure. This should be understood to mean that the actuator mirror electrode 42 has a fixed, constant voltage applied thereto.

The actuator mirror electrode 42 has a complementary embodiment to the actuator transducer stator electrodes $37_i$. In particular, it forms a ring with actuator transducer mirror comb fingers 43, which, for simplification purposes, are also referred to as mirror comb fingers or only as comb fingers 43 below. In terms of their geometric properties, the mirror comb fingers 43 of the actuator mirror electrode 42 substantially correspond to the stator comb fingers 38 of the actuator transducer stator electrodes $37_i$.

All comb fingers 38, 43 may have the same height h, i.e. identical dimensions in the direction of the surface normal 36. This simplifies the production process.

In the direction of the surface normal 36, the mirror comb fingers 43 of the actuator mirror electrode 42 may also have a different height to that of the stator comb fingers 38 of the active actuator transducer stator electrodes $37_i$.

The comb fingers 38, 43 may have a height h that decreases in the radial direction. It is also possible to embody the comb fingers 38, 43 in the region of the corners of the optical component 30 to be shorter than the remaining comb fingers 38, 43. This can facilitate a greater tilt angle of the individual mirror 20.

In particular, the actuator mirror electrode 42 is embodied in such a way that in each case one of the comb fingers 43 of the actuator mirror electrode 42 is able to be immersed in an interstice between two of the comb fingers 38 of the actuator transducer stator electrodes $37_i$.

The actuator mirror electrode 42 is connected to the mirror body 27 in an electrically conductive manner. Therefore, their comb fingers 43 are equipotential. The mirror body 27 has a low resistance connection to the base plate by way of an electrically conductive joint spring. In principle, it is also possible to individually electrically connect the mirror substrate, i.e. the mirror body 27, the actuator mirror electrodes 42 and the sensor mirror electrodes 45, by way of separate supply lines via the flexure 32 and thus, for example, put these at different potentials or decouple these in respect of faults and/or crosstalk. The base plate may be grounded, but this need not be the case. Alternatively, the mirror can be connected to a voltage source, in particular via a conductive joint spring. The mirror body 27 can also be galvanically isolated from the base plate. As a result of this, it is possible to apply a fixed or variable bias voltage to the mirror.

An actuator voltage $U_A$ can be applied to the actuator transducer stator electrodes $37_i$ for pivoting the individual mirror 20. Therefore, the actuator transducer stator electrodes $37_i$ are also referred to as active actuator transducer stator electrodes $37_i$. A voltage source that is not depicted in the figures is provided for applying the actuator voltage $U_A$ to the actuator transducer stator electrodes $37_i$. The actuator voltage $U_A$ is at most 200 volts, in particular at most 100 volts. By suitably applying the actuator voltage $U_A$ to a selection of the actuator transducer stator electrodes $37_i$, the individual mirror 20 can be tilted by up to 50 mrad, in particular up to 100 mrad, in particular up to 150 mrad, from a neutral position. Alternatively, the actuators can also be actuated by a charge source (current source).

Different actuator voltages $U_{Ai}$ can be applied to the various actuator transducer stator electrodes $37_i$ for pivoting the individual mirror 20. A control device that is not illustrated in the figures is provided for controlling the actuator voltages $U_{Ai}$.

For the purposes of tilting one of the individual mirrors 20, an actuator voltage $U_{A1}$ is applied to one of the actuator transducer stator electrodes $37_i$. At the same time, an actuator voltage $U_{A2} \neq U_{A1}$ deviating therefrom is applied to the actuator transducer stator electrode $37_j$ that lies opposite thereto in relation to the surface normal 36. Here, $U_{A2}$ may =0 volts. In particular, it is possible to apply the actuator voltage $U_{A1}$ to only one of the actuator transducer stator electrodes $37_i$, while all other actuator transducer stator electrodes $37_j$ are kept at a voltage of 0 volts.

When the individual mirror 20 is tilted, the comb fingers of the actuator mirror electrode 42 are immersed more deeply between the comb fingers 38 of the actuator transducer stator electrode $37_i$ on one side, in particular in the region of this actuator transducer stator electrode $37_i$ to which the actuator voltage $U_A$ has been applied. On the opposite side of the tilt axis 33, the actuator mirror electrode 42 is immersed less deeply into the actuator transducer stator electrodes $37_j$. The actuator mirror electrode 42 may even emerge from the actuator transducer stator electrodes $37_j$, at least in regions.

The comb overlap, i.e., the immersion depth of the actuator mirror electrode 42 between the actuator transducer stator electrodes $37_i$, lies in the range from 0 µm to 50 µm in the neutral position of the individual mirror 20 in the case of a mirror dimension of approximately 0.5 mm×0.5 mm.

In particular, the dimensions and distances between the comb fingers 43 of the actuator mirror electrode 42 and the comb fingers 38 of the actuator transducer stator electrodes $37_i$ are selected in such a way that the comb fingers 43 and the comb fingers 38 come no closer than 1 µm from one another in the case of a maximum tilt of the mirror 20, for example through approximately 100 mrad. Consequently, the comb fingers 43 of the actuator mirror electrode 42 and the comb fingers 38 of the actuator transducer stator electrodes $37_i$ are spaced apart from one another, in particular without contact, in every pivot position of the mirror 20. In particular, the immersion depth, i.e. the comb overlap, is selected in such a way that this is ensured.

In accordance with an alternative, the comb fingers 38, 43 are slightly shorter in the outer region and therefore have a relatively small overlap, i.e. a shallower immersion depth. By way of example, the immersion depth in the outermost region may be approximately half as deep as the immersion depth in the inner region. These specifications also relate to the neutral position of the mirror 20.

By way of a dependence of the immersion depth of the comb fingers 38, 43 on the radial position thereof, it is also possible to influence the characteristic, in particular the linearity of the actuation.

Since all of the actuator transducer stator electrodes $37_i$ are arranged in a single plane, the actuator plane 40, it is possible to dispense with complicated series kinematics. The displacement device 31 is distinguished by parallel kinematics.

In particular, the displacement device 31 has no movably arranged active components. All of the actuator transducer stator electrodes $37_i$, to which the actuator voltage $U_A$ can be applied, are arranged in an immovable stationary manner on the substrate 39.

A sensor device is provided for capturing the pivot position of the individual mirror 20. The sensor device may form a constituent part of the displacement device 31.

The sensor device comprises sensor transducer mirror electrodes 45 and sensor transducer stator electrodes $44_i$. The sensor transducer mirror electrodes 45 are arranged on the individual mirror 20. They form movable electrodes.

The sensor unit comprises four sensor transducer stator electrodes $44_1$ to $44_4$. For simplification purposes, the sensor transducer stator electrodes $44_i$ are also referred to only as sensor electrodes. For the actuation, it is advantageous if the number of sensor transducer stator electrodes $44_i$ precisely corresponds to the number of actuator transducer stator electrodes $37_i$. However, the number of sensor transducer stator electrodes $44_i$ can also deviate from the number of actuator transducer stator electrodes $37_i$.

The sensor device will be described in yet more detail below. The sensor transducer stator electrodes $44_i$ are arranged in a ring-shaped region on the substrate 39. In particular, they are arranged in a region within the actuator transducer stator electrodes $37_i$. The ring-shaped regions of the actuator transducer stator electrodes $37_i$ and the sensor transducer stator electrodes $44_i$ can form concentric circles.

The actuator transducer stator electrodes $37_i$ are respectively arranged in quadrants $54_1$ to $54_4$ on the substrate 39. The sensor transducer stator electrodes $44_i$ are respectively arranged in the same quadrant $54_1$ to $54_4$ as respectively one of the actuator transducer stator electrodes $37_i$. The sensor transducer stator electrodes $44_i$ in the same quadrant $54_1$ to $54_4$ can be combined into groups in each case, with all electrodes of one group contributing to the output of the same signal. The actuator device 31, in particular the arrangement and embodiment of the actuator transducer stator electrodes $37_i$, has substantially the same symmetry properties as the reflection surface 26 of the individual mirror 20. The sensor device, in particular the sensor transducer stator electrodes $44_i$, has substantially the same symmetry properties as the reflection surface 26 of the individual mirror 20. The sensor device, in particular the sensor transducer stator electrodes $44_i$, can also have a radial symmetry.

Respectively two groups of sensor transducer stator electrodes $44_i$ that lie opposite one another in respect of the effective pivot point 35 are interconnected in a differential manner. However, such an interconnection is not mandatory. In general, it is advantageous if respectively two sensor electrodes $44_i$ that lie opposite one another in respect of the effective pivot point 35, or corresponding groups of such sensor electrodes $44_i$, are embodied and arranged in such a way that they can be read in a differential manner.

The sensor transducer stator electrodes $44_i$ are embodied as comb electrodes. In particular, the sensor transducer stator electrodes $44_i$ can be embodied in a manner corresponding to the actuator transducer stator electrodes $37_i$, with reference herewith being made to the description thereof. The sensor transducer stator electrodes $44_i$ each comprise a sensor transducer stator transmitter electrode 47, which is also abbreviated as transmitter electrode below, and a sensor transducer stator receiver electrode 48, which is also abbreviated as receiver electrode below. Both the sensor transducer stator transmitter electrode 47 and the sensor transducer stator receiver electrode 48 have a comb structure. In particular, they comprise a plurality of comb fingers. In particular, the comb fingers of the sensor transducer stator transmitter electrode 47 are arranged in alternation with the comb fingers of the sensor transducer stator receiver electrode 48.

The sensor device comprises a sensor transducer mirror electrode 45 for each of the sensor transducer stator electrodes $44_i$. In accordance with an advantageous embodiment, the sensor transducer mirror electrodes 45 each form a shielding unit of the sensor transducer stator electrodes $44_i$. The sensor transducer mirror electrode 45 in each case comprises comb elements with a plurality of comb fingers 46. The sensor transducer mirror electrode 45 is embodied in accordance with a counter electrode fitting to the sensor transducer stator electrodes $44_i$. In particular, the sensor transducer mirror electrodes 45 can be embodied in a manner corresponding to the actuator transducer mirror electrodes 42, with reference herewith being made to the description thereof.

The sensor transducer mirror electrodes 45 are respectively connected in a secured manner to the mirror body 27. When the individual mirror 20 is tilted, the sensor transducer mirror electrode 45 can respectively be immersed to a different depth between the comb fingers of the sensor transducer stator electrodes $44_i$, in particular between the transmitter electrode 47 and the receiver electrode 48. As a result of this, there is a variable shielding of adjacent comb fingers, in particular a variable shielding of the receiver electrode 48 from the transmitter electrode 47. This leads to a change in the capacitance between the adjacent comb fingers of the sensor transducer stator electrodes $44_i$ when the individual mirror 20 is pivoted. This change in capacitance can be measured. To this end, the inputs of a measuring appliance are alternately connected to the comb fingers of the sensor transducer stator electrodes $44_i$.

The immersion depth of the sensor transducer mirror electrodes 45 between the sensor transducer stator electrodes $44_i$, in particular between the transmitter electrodes 47 and the receiver electrodes 48, is 30 µm in the neutral position. The immersion depth in the neutral position can lie in the range from 20 µm to 60 µm. This ensures that the comb fingers 46 still have a residual immersion depth everywhere between the transmitter electrodes 47 and the receiver electrodes 48, even in the maximally tilted pivot position, i.e. they never completely emerge. This ensures the differential sensor operation over the entire tilt range. On the other hand, the immersion depth of the sensor transducer mirror electrode 45 is selected in such a way that there is no collision of same with the substrate 39, even in the maximally tilted pivot position of the individual mirror 20.

An electric voltage, in particular a sensor voltage $U_S$, is applied to the transmitter electrode 47 for the purposes of measuring the capacitance between the transmitter electrode 47 and the receiver electrode 48 of the sensor transducer stator electrodes $44_i$. In particular, an AC voltage can serve as a sensor voltage $U_S$.

Figure 4:
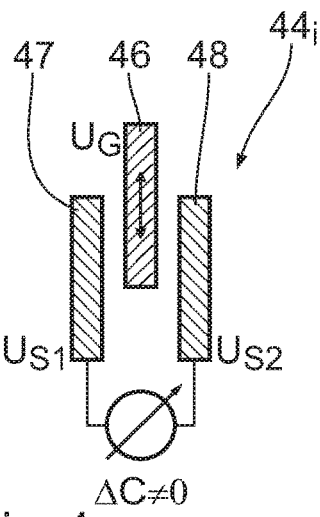
FIGS. 4 to 6 show schematic illustrations of a section of the sensor device for explaining the sensitivity (FIG. 4) and insensitivity (FIGS. 5 and 6) of same.
Figure 5:
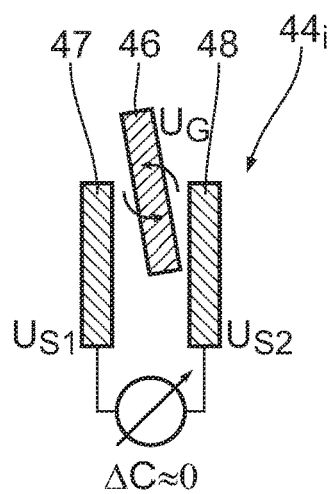
Figure 6:
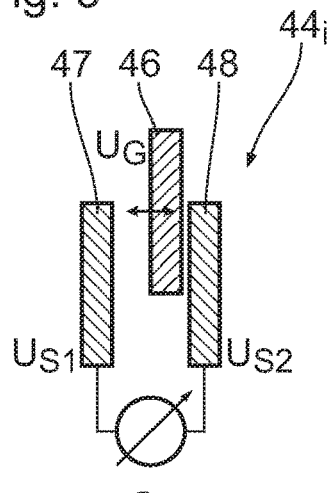
Figure 7:
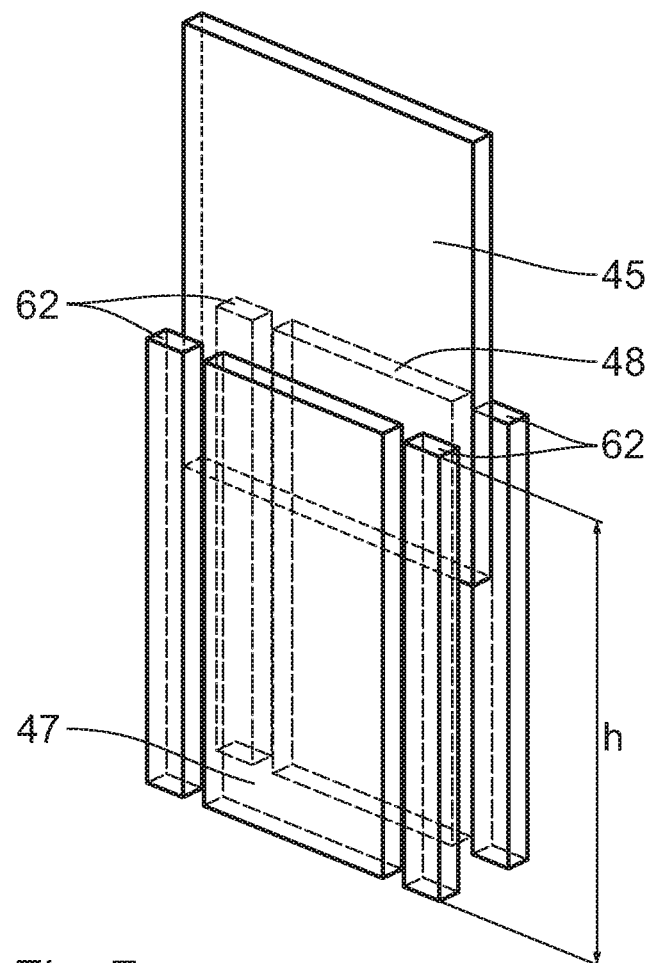
FIG. 7 shows a schematic view of two adjacent sensor electrodes with shielding electrodes and a movable electrode arranged therebetween.
Figure 8:
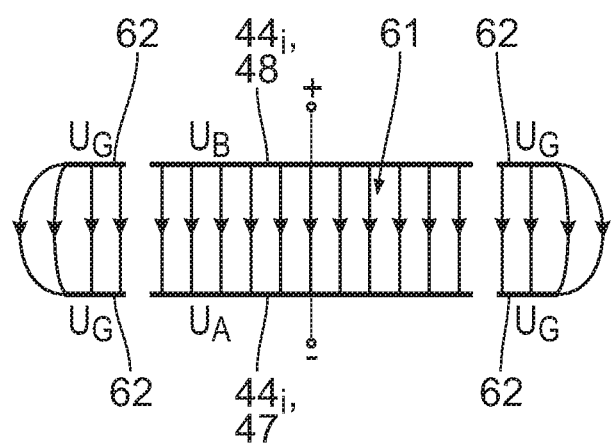
FIG. 8 schematically shows an illustration of the electric field in the region between the sensor electrodes for the purposes of explaining the effect of the shielding electrodes, with the movable electrode not being illustrated.

As illustrated in exemplary fashion in FIGS. 4 to 6, adjacent comb fingers of the sensor transducer stator electrodes $44_i$ are alternately held at different electric potentials $U_{S1}$, $U_{S2}$. By way of example, the transmitter electrodes 47 are held at a potential $U_{S1}$ and the receiver electrodes 48 are held at an electric potential $U_{S2}$.

The comb fingers 46 of the movable electrode 45 are preferably all held at the same potential, for example $U_G$.

The sensor device is sensitive in view of the immersion depth of the comb fingers 46 between adjacent comb fingers of the sensor transducer stator electrodes $44_i$ (FIG. 4).

The sensor device is insensitive in relation to pure pivoting of the comb finger 46 relative to the transmitter electrode 47 and the receiver electrode 48 (FIG. 5).

The sensor device is insensitive in relation to a lateral displacement of the shielding element which changes the distance of same from the transmitter electrode 47 and from the receiver electrode 48 but leaves the immersion depth of the comb finger 46 between the adjacent transmitter and receiver electrodes 47, 48 unchanged (FIG. 6).

Further details of the sensor device are described more closely below.

The sensor transducer stator electrodes $44_i$ are arranged within the ring of the actuator transducer stator electrodes $37_i$. In this region, the absolute movements of the comb fingers 46 in the direction parallel to the surface normal 36 are less than outside of the ring of the actuator transducer stator electrodes $37_i$. The absolute scope of movement is related to the distance from the effective pivot point 35.

The comb fingers of the sensor transducer stator electrodes $44_i$ are arranged within the ring of the actuator transducer stator electrodes $37_i$, in particular in a separate ring.

The comb fingers of the sensor transducer stator electrodes $44_i$ are embodied and arranged radially relative to the effective pivot point 35. The sensor transducer stator electrodes $44_i$ have comb fingers that extend in the radial direction in particular. This reduces the sensitivity in relation to a possible thermal expansion of the individual mirror 20.

As already explained above, on account of its structure, the sensor device has, at best, a minimal sensitivity in view of parasitic movements of the individual mirror 20, in particular in view of displacements perpendicular to the surface normal 36 and/or rotations about the surface normal 36. On account of the shielding principle of the sensor device, the latter also has, at best, a minimal sensitivity in view of a possible thermal expansion of the individual mirror 20. Moreover, the sensor principle has a minimal sensitivity in view of thermal bending of the mirror.

Respectively two sensor units that lie opposite one another in respect of the effective pivot point 35, each with at least one transmitter electrode 47 and at least one receiver electrode 48, are interconnected in a differential manner or at least readable in a differential manner. This renders it possible to eliminate errors in the measurement of the position of the mirror 20, in particular on account of eigenmodes of the individual mirror 20.

The active constituent parts of the sensor device are arranged on the substrate 39. This renders it possible to measure the tilt angle of the individual mirror 20 directly relative to the substrate 39. Moreover, the length of the signal line and/or of the supply lines can be reduced, in particular minimized, on account of the arrangement of the transmitter electrodes 47 and the receiver electrodes 48 on the substrate 39. This reduces possible disturbing influences. This ensures constant operating conditions.

An AC voltage from a voltage source can be applied to the transmitter electrodes 47. The voltage source has a low impedance. In particular, the voltage source has an output impedance which, in the region of the excitation frequency, is less than 1 part in a thousand of the coupling capacitances from the actuator transducer stator electrodes $37_i$ to the transmitter electrodes 47. The output impedance of the voltage source is less than 1 part in a thousand of the capacitances between the transmitter electrodes 47 and the sensor transducer mirror electrodes 45 or the receiver electrodes 48. This ensures that the AC voltage that is applied to the transmitter electrodes 47 is not influenced, or at least not substantially influenced, by the variable actuator voltages $U_A$ or by the variable sensor capacitance.

The joint 32 is embodied as a Cardan-type flexure.

The joint 32 can be embodied as a torsion spring element structure in particular. In particular, it comprises two torsion springs 50, 51. The two torsion springs 50, 51 have an integral embodiment. In particular, they are aligned perpendicular to one another and form a cross-shaped structure 49.

The torsion springs 50, 51 have a length of approximately 100 μm, a width of approximately 60 μm, and a thickness of approximately 1 μm to 5 μm. Such torsion springs 50, 51 are suitable as individual mirrors 20 with dimensions of 0.6 mm·0.6 mm. The dimensions of the torsion springs 50, 51 depend on the dimensions of the individual mirrors 20. In general, larger mirrors involve larger, in particular stiffer torsion springs 50, 51.

The torsion spring 50 extends in the direction of the tilt axis 33. The torsion spring 50 is mechanically connected to the substrate 39. Connecting blocks 52 serve to connect the torsion spring 50 to the substrate 39. The connecting blocks 52 in each case have a cuboid embodiment. They can also have a cylindrical, in particular circular-cylindrical embodiment. Other geometric forms are likewise possible.

The connecting blocks 52 are respectively arranged in an end region of the torsion spring 50.

In addition to the connection of the joint 32 to the substrate 39, the connecting blocks 52 also serve as spacers between the torsion spring 50 and the substrate 39.

In a manner corresponding to the connection of the torsion spring 50 to the substrate 39, the torsion spring 51 is mechanically connected to the mirror body 27 of the individual mirror 20. Connecting blocks 53 are provided to this end. In terms of their embodiment, the connecting blocks 53 correspond to the connecting blocks 52. The connecting blocks 53 are respectively arranged in an end region of the torsion spring 51.

The joint 32 can also have a different embodiment. In particular, it can have bending springs instead of the torsion springs 50, 51.

In the direction of the surface normal 36, the connecting blocks 53 and the connecting blocks 52 are arranged on opposite sides of the cross-shaped structure 49.

Further advantageous aspects of the sensor device are described below with reference to FIGS. 7 to 10.

It was recognized that the electric field between two comb fingers 47, 48 of the sensor transducer stator electrodes $44_i$ generally is not homogeneous in the radial direction over the entire extent of the comb fingers 47, 48 of the sensor transducer stator electrodes $44_i$. The electric field has inhomogeneities, in particular in the edge region of the comb fingers 47, 48 of the sensor transducer stator electrodes $44_i$. This can lead to a lateral displacement of the comb fingers 47, 48 of the sensor transducer mirror electrodes 45 possibly leading to measurement artifacts, in particular to errors in the detection of the tilt angle of the individual mirror 20, in the radial direction.

In order to prevent such measurement errors, at least one mechanism for restricting the electric field 61 that is relevant to the measurement to the region between two adjacent comb fingers 47, 48 of the sensor transducer stator electrodes $44_i$ is provided. In particular, provision is made for the influence of stray fields in the edge regions of the comb fingers on the measurement of the displacement position to be minimized by way of such a mechanism.

In particular, shielding electrodes 62 are provided as a mechanism for restricting the electric field 61 that is relevant to the measurement in the region between two adjacent comb fingers 47, 48 of the sensor transducer stator electrodes $44_i$. The shielding electrodes 62 are each arranged along a continuation of one of the comb fingers 47, 48 of the sensor transducer stator electrodes $44_i$. In particular, they are each arranged on the comb fingers 47, 48 of the sensor transducer stator electrodes $44_i$, both on the outside and inside in the radial direction. Preferably, they each form a continuation of the comb fingers 47, 48 of the sensor transducer stator electrodes $44_i$. They are separated by a narrow gap from the comb fingers 47, 48 of the sensor transducer stator electrodes $44_i$. The width of the gap lies in the range between 3 μm and 6 μm, in particular.

In a direction perpendicular to the substrate 39, the shielding electrodes 62 preferably have the same height h as the comb fingers 47, 48 of the sensor transducer stator electrodes $44_i$ or form a continuation of the corresponding external contour of same.

Preferably, two shielding electrodes 62 are provided for each of the comb fingers 47, 48 of the sensor transducer stator electrodes $44_i$, in particular for each of the transmitter electrodes 47 and each of the receiver electrodes 48.

Figure 9:
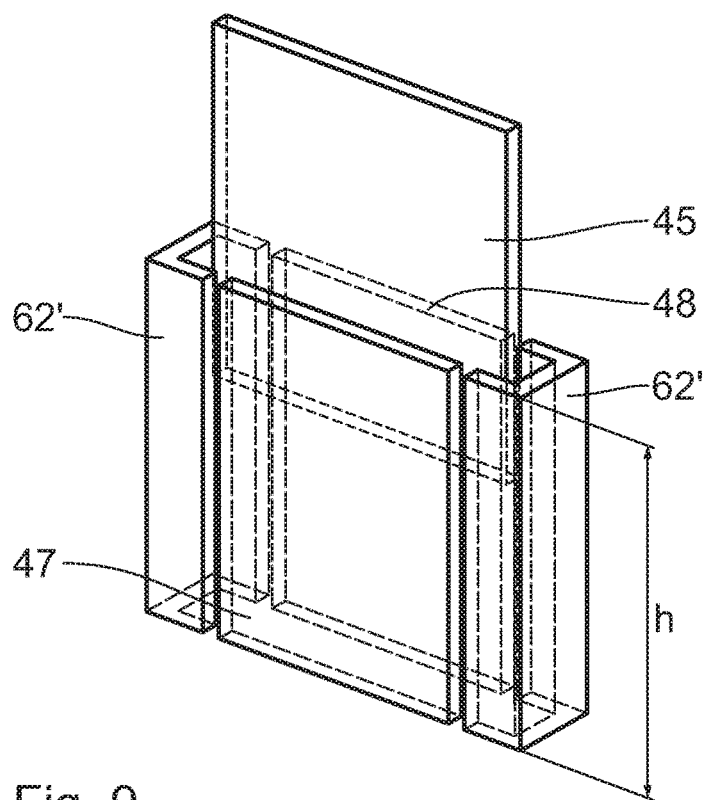
FIG. 9 shows an illustration corresponding to FIG. 7 with an alternative embodiment of the shielding electrodes.

The shielding electrodes 62 of a pair of transmitter electrodes 47 and receiver electrodes 48 can be connected to one another to form a single shielding electrode 62'. A corresponding alternative is illustrated in FIG. 9. The shielding electrodes 62' consequently have a U-shaped cross section.

It is also possible to connect all of the shielding electrodes 62 of the sensor device to one another in electrically conductive fashion. A corresponding alternative is illustrated schematically in FIG. 10. In this alternative, the shielding electrodes 62; 62' are respectively connected to one another in electrically conductive fashion in an inner circle 63 and an outer circle 64.

The shielding electrodes 62; 62' are preferably each held at the same electric potential ($U_G$) as the sensor transducer mirror electrodes 45. What this can achieve is that the shielding electrodes 62; 62' are connected to the sensor transducer mirror electrodes 45 in electrically conductive fashion.

Preferably, the sensor transducer mirror electrodes 45 are embodied in such a way that they have a greater extent in the radial direction than the sensor transducer stator electrodes $44_i$. In particular, they are embodied in such a way that, in the radial direction, they extend over the entire region between two adjacent comb fingers 47, 48 of the sensor transducer stator electrodes $44_i$ and into the region between the shielding electrodes 62; 62'. What this can ensure is that the sensor transducer mirror electrodes 45, in the radial direction, cover the entire region of the electric field 61 between the adjacent comb fingers of the sensor transducer stator electrodes $44_i$, even in the case of a minor lateral displacement, in particular when the individual mirror 20 expands on account of heating of the same.

Figure 10:
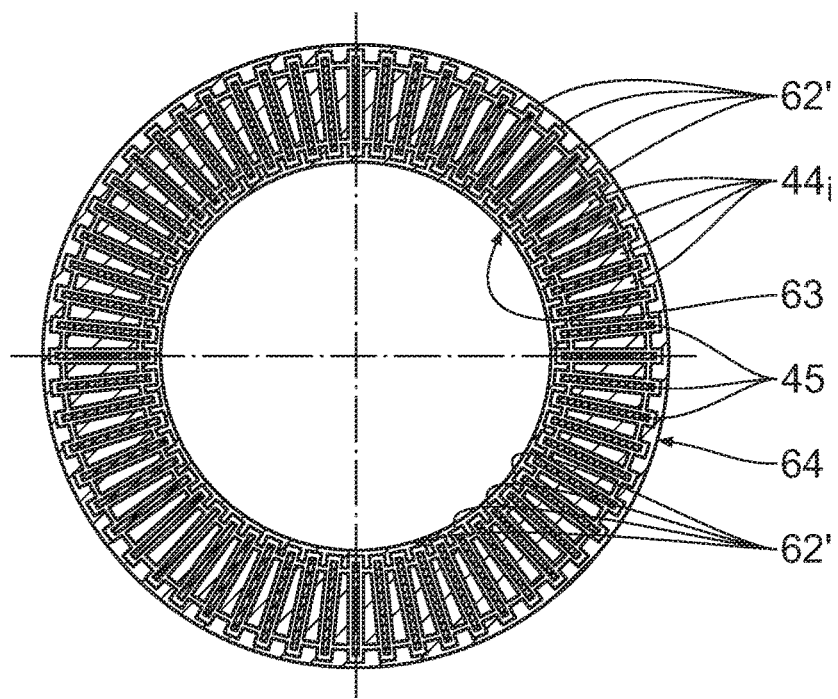
FIG. 10 shows a schematic plan view of the stator electrodes with the shielding electrodes according to a further alternative.

In the exemplary embodiment illustrated in FIG. 10, the electrodes of the actuator device can form the electrodes of the sensor device at the same time. In this case, the actuator transducer stator electrodes $37_i$ precisely also form the sensor transducer stator electrodes $44_1$. The actuator transducer mirror electrodes 42 are identical to the sensor transducer mirror electrodes 45. For further details, reference is made to DE 10 2015 204 874 A1.

However, the variant illustrated in FIG. 10 can also serve as a separate sensor device. In particular, it can be provided as a separate electrode structure in addition to the actuator structure. It particular, it can be arranged in the inner region of the actuator device. In particular, it can be embodied as a separate ring structure.

What is claimed is:

1. A sensor device configured to capture a displacement position of an optical component, the sensor device comprising:
a plurality of stator electrodes, each stator electrode comprising a plurality of individual electrodes arranged in a ring-shaped region and extending in a plane through a central axis of the ring-shaped region;
a movable electrode configured to variably shield an electric field in a region of the stator electrodes depending on a displacement position of the optical component; and
shielding electrodes configured to restrict the electric field relevant to a measurement of the displacement position of the optical component to the region of the stator electrodes,
wherein:
each shielding electrode is different from all of the stator electrodes; and
each shielding electrode is different from the movable electrode.

2. The sensor device of claim 1, wherein each shielding electrode is arranged along a continuation of one of the stator electrodes.

3. The sensor device of claim 1, wherein at least a subset of the shielding electrodes defines a U-shaped cross section.

4. The sensor device of claim 1, wherein the movable electrode extends over an entire region between the stator electrodes in a radial direction and into a region between two shielding electrodes arranged along the continuation of the stator electrodes.

5. The sensor device of claim 1, wherein the sensor device is configured so that, during use of the sensor device, each shielding electrode is held at a same electric potential as the movable electrode.

6. The sensor device of claim 1, wherein at least a subset of the shielding electrodes is connected to each other in an electrically conductive fashion to define a ring-shaped structure.

7. The sensor device of claim 1, wherein the stator electrodes comprise first comb fingers.

8. The sensor device of claim 7, wherein the movable electrode comprises a plurality of movable electrodes comprising second comb fingers.

9. The sensor device of claim 8, wherein the first and second comb fingers are configured so that, during use of the sensor device, the measurement of the displacement position of the optical element is based on a capacitance between neighboring first comb fingers.

10. The sensor device of claim 1, wherein the stator electrodes and the movable electrode are configured so that, during use of the sensor device, the measurement of the displacement position of the optical element is based on a capacitance between neighboring stator electrodes.

11. The sensor device of claim 1, wherein the movable electrode is disposed on the optical element.

12. The sensor device of claim 1, wherein:
the stator electrodes comprise first comb fingers;
the movable electrode comprises a plurality of movable electrodes;
the plurality of movable electrodes comprises second comb fingers disposed on the optical element; and
the first and second comb fingers are configured so that, during use of the sensor device, the measurement of the displacement position of the optical element is based on a capacitance between neighboring first comb fingers.

13. An arrangement, comprising:
an optical component; and
a sensor device of claim 1.

14. The arrangement of claim 13, further comprising a plurality of mirrors.

15. An illumination optical unit, comprising:
an optical component; and
a sensor device of claim 1,
wherein the illumination optical unit is a projection exposure illumination optical unit.

16. The illumination optical unit of claim 15, further comprising a plurality of mirrors.

17. An illumination system, comprising:
a radiation source configured to generate illumination radiation;
an optical component; and
a sensor device of claim 1,
wherein the illumination system is a projection exposure illumination system.

18. An apparatus, comprising:
an illumination unit, comprising:
an optical component; and
a sensor device of claim 1; and
a projection optical unit configured to project an object in an object field of the illumination optical unit onto an image field of the projection optical unit,
wherein the apparatus is a microlithographic projection exposure apparatus.

19. A method of using a microlithographic projection exposure apparatus comprising an illumination optical unit and a projection optical unit, the method comprising:
using the illumination optical unit to illuminate at least a portion of a reticle in an object field of the illumination optical unit; and
using the projection optical unit to project the illuminated portion of the reticle onto a light-sensitive material in an image field of the projection optical unit,
wherein the illumination optical unit comprises the sensor device of claim 1.

20. An arrangement, comprising:
a facet mirror comprising a plurality of individual mirror facets which comprises a first mirror facet; and
a sensor device, comprising:
a plurality of stator electrodes, each stator electrode comprising a plurality of individual electrodes arranged in a ring-shaped region and extending in a plane through a central axis of the ring-shaped region;
a movable electrode disposed on the first mirror facet, the movable electrode being configured to variably shield an electric field in a region of the stator electrodes depending on a displacement position of the first mirror facet; and shielding electrodes configured to restrict the electric field relevant to a measurement of the displacement position of the first mirror facet to the region of the stator electrodes, wherein:

each stator electrode comprises a first comb finger;

each first comb finger has a length which is greater than its width;

the length of each first comb finger extends radially from the central axis;

the movable electrode comprises a plurality of movable electrodes comprising second comb fingers;

each second comb finger has a length which is greater than its width;

the length of each second comb finger extends radially from the central axis;

the first and second comb fingers are configured so that, during use of the sensor device, the measurement of the displacement position of the first mirror facet is based on a capacitance between neighboring first comb fingers;

each shielding electrode is different from all of the stator electrodes; and each shielding electrode is different from the movable electrode.

* * * * *

UNITED STATES PATENT AND TRADEMARK OFFICE
CERTIFICATE OF CORRECTION

PATENT NO. : 10,514,276 B2  
APPLICATION NO. : 16/247672  
DATED : December 24, 2019  
INVENTOR(S) : Ralf Ameling et al.

Page 1 of 1

It is certified that error appears in the above-identified patent and that said Letters Patent is hereby corrected as shown below:

In the Specification

Column 19, Line 7, delete "$44_1$." and insert -- $44_i$. --.

Signed and Sealed this  
Seventh Day of April, 2020

Andrei Iancu  
*Director of the United States Patent and Trademark Office*